United States Patent [19]

Morrone

[11] Patent Number: 5,760,582
[45] Date of Patent: Jun. 2, 1998

[54] OPTIMIZED GRADIENT COILS AND SHIM COILS FOR MAGNETIC RESONANCE SCANNING SYSTEMS

[75] Inventor: Terry Morrone, Greenlawn, N.Y.

[73] Assignee: Fonar Corporation, Melville, N.Y.

[21] Appl. No.: 917,223

[22] Filed: Jul. 23, 1992

[51] Int. Cl.⁶ .................................................. G01V 3/00
[52] U.S. Cl. ................................. 324/318; 324/322
[58] Field of Search ........................... 324/300, 307, 324/309, 310, 311, 312, 313, 314, 318, 319, 320, 322; 128/653.2, 653.3; 335/306

[56] References Cited

U.S. PATENT DOCUMENTS

| | | | |
|---|---|---|---|
| 4,157,495 | 6/1979 | Grover et al. | 324/302 X |
| 4,439,733 | 3/1984 | Hinshaw et al. | 324/322 |
| 4,737,716 | 4/1988 | Roemer et al. | |
| 4,794,338 | 12/1988 | Roemer et al. | |
| 5,146,197 | 9/1992 | Lowe | 324/318 |
| 5,185,576 | 2/1993 | Vavrek et al. | 324/318 |
| 5,250,901 | 10/1993 | Kaufman et al. | 324/318 |
| 5,361,054 | 11/1994 | Knuttel | 324/318 |
| 5,495,222 | 2/1996 | Abele et al. | 335/306 |

*Primary Examiner*—Sandra L. O'Shea
*Assistant Examiner*—M. Eisenberg
*Attorney, Agent, or Firm*—Brooks Haidt Haffner & Delahunty

[57] ABSTRACT

Gradient coil assemblies and shim coil assemblies are disclosed for magnetic resonance imaging ("MRI") devices, wherein the coil assemblies comprise a coil support and a conductive wire having a locus described by a solution of a current continuity equation over a finite interval for which certain terms of the magnetic field expansion are equal to zero, for generating non-uniform magnetic fields. The gradient coil produces gradient fields and magnetic fields which cancel non-uniformities in the magnetic field of the magnet of the MRI device. Shim coils cancel such non-uniformities, as well. A method of manufacturing such coils is also disclosed.

25 Claims, 4 Drawing Sheets

OPTIMIZED GRADIENT COILS AND SHIM COILS FOR MAGNETIC RESONANCE SCANNING SYSTEMS

FIELD OF THE INVENTION

The present invention relates to optimized gradient coils and shim coils for magnetic resonance scanning systems, including optimized shielded gradient coils and shim coils for use in vertical field magnetic resonance imaging systems.

BACKGROUND OF THE INVENTION

Magnetic resonance scanning systems include magnetic resonance imaging (MRI) and magnetic resonance spectroscopy (MRS) systems. These systems, and particularly those used for medical imaging, are required to develop a highly uniform magnetic field and precise and controllable time-varying gradients within that magnetic field. MRI systems typically include a magnetic structure for developing the uniform magnetic field and auxiliary coils through which currents flow in order to superimpose gradients on the magnetic field. The magnetic field uniformity is improved by the use of auxiliary correcting coils through which current flows to make corrections for non-uniformity of the magnetic field. This correcting is called "shimming" the magnetic field, and the correcting coils are referred to as shim coils.

The design of gradient coils and shim coils has received considerable attention in recent years. The design techniques used can be broadly classified in two categories. With the target field method a current distribution is established which develops a magnetic field having the target values at the specified points of space. See R. Turner, A Target Field Approach to Optimal Coil Design. J. Phys. D:Appl. Phys. 19, L147–L151 (1986).

An alternative method of field modification involves representing the field as a sum of orthogonal basis functions and determining the amplitude that each basis function should have in order to achieve the desired field. A coil or other conductive path is established for flowing current which is effective to generate the field described by the summation of basis functions. See F. Romeo and D. I. Hoult, Magnet Field Profiling: Analysis and Correcting Coil Design, Magnetic Resonance in Medicine 1, 44–65 (1984).

A particularly important class of coils in the MRI field are self-shielded gradient coils. These coils are configured to generate a desired gradient field within a region of space when current flows through the coils and so that the magnetic field outside the coils is as near to zero as possible. Self-shield gradient coils minimize the interaction between the gradient magnetic field and the MRI system structure. Various approaches to the construction of self-shielded gradient coils have been proposed. See P. Mansfield and B. Chapman, Active Magnetic Screening of Gradient Coils in MR Imaging, Journal of Magnetic Resonance 66, 573–576 (1986) and U.S. Pat. No. 4,737,716 issued to P. B. Romer, et al., for self-shielded gradient coils for nuclear magnetic resonance imaging.

The structure of gradient coils and shim coils for MRI systems necessarily involves departures from ideality. First, if an ideal current distribution extends to infinity, it must be truncated so it occupies a finite region of space. Coils of infinite extent are obviously not realizable and as a practical matter, the coils will be physically smaller than the MRI system overall. Secondly, the ideal current distribution is frequently a continuous current sheet which can only be approximated by a discrete distribution of current flowing through wires. Thirdly, the design methods used to determine the coil configurations and dimensions themselves introduce non-idealities into the resulting coil. In particular, the target field method yields current paths that exhibit large spatial oscillations which make the coils difficult to build.

It is an object of the invention to provide gradient and shim coils for MRI scanners which are optimized for the case of finite, discrete current distributions and which do not use the target field method in their design.

It is another object of the invention to provide a self-shielded gradient coil for MRI scanners.

Another object of the invention is to provide a method of manufacturing coils of the type just described.

SUMMARY OF THE INVENTION

According to the invention, a gradient coil, or shim coil assembly for magnetic resonance imaging is comprised of an insulating coil support having a major surface, and a conductive wire defining a gradient coil disposed on the coil support and having a locus described by the solution of the current continuity equation over a finite interval for which certain terms of the magnetic field expansion are equal to zero. In one preferred embodiment the insulative coil support is planer so that the conductive wire defining a gradient coil is confined to a plane.

In still another embodiment, the gradient coil is a self-shielded gradient coil for minimizing magnetic interaction between the gradient field and the MRI scanner in which the self-shielded gradient coil is used.

DETAILED DESCRIPTION OF THE PREFERRED EMBODIMENTS

Figure 1:
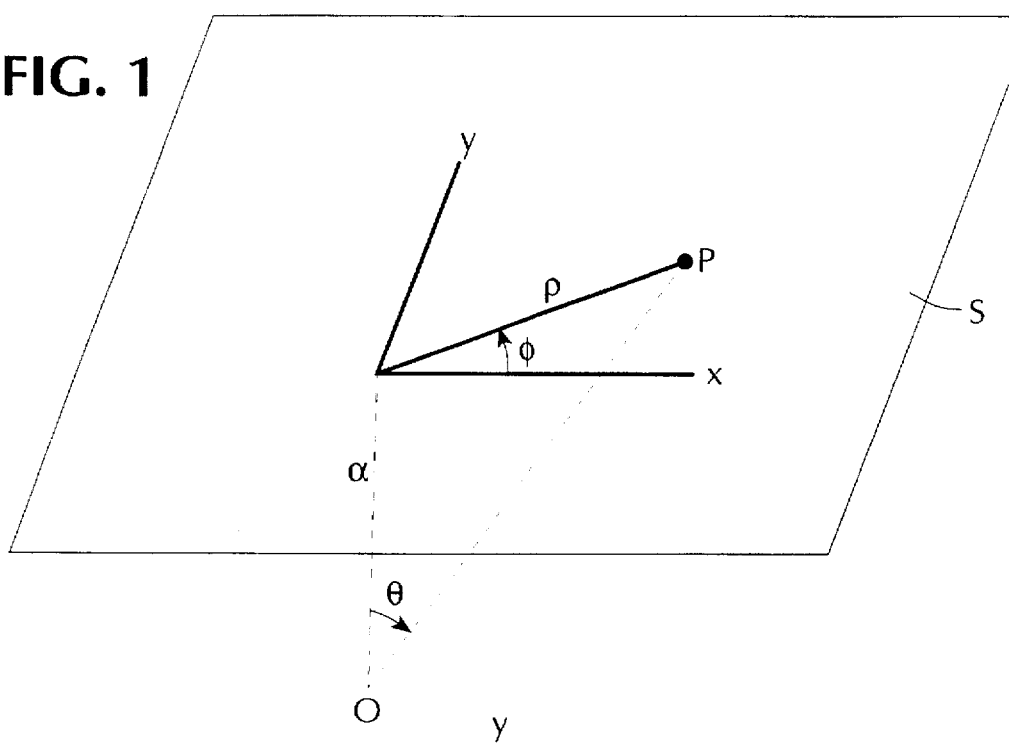
FIG. 1 illustrates the coordinate system used in the specification.

The following discussion uses a spherical coordinate system which is shown in FIG. 1. In the coordinate system the position of a point P is determined relative to an origin O by the three parameters $\theta$, $\phi$, and $\rho$. The point P lies within an imaginary plane S which is a distance from the origin O. Within the plane S the position of the point P is determined by azimuth angle $\phi$ and the radius vector $\rho$. The line of sight from the origin O to the point P makes an angle $\theta$ with respect to the distance line from the origin to the plane S. The spherical coordinate system was chosen because the preferred embodiments of coils disclosed below are for an MRI system having a vertical field magnet in which the coils are provided in pairs each adjacent a respective magnet pole face. Accordingly, one coil will be described as lying within the imaginary plane S and the second coil in a second imaginary plane (not shown) at a distance of −a from the origin O.

The desired gradient coil shape and dimensions are determined by first representing the magnetic field as a summation of the orthogonal set of basis functions, determining the spatial relationship between the field and the current which generates it and finally solving for the current density. The current density is also represented by orthogonal basis functions (not necessarily the same as those used to represent the magnetic field).

Spherical Harmonic Representation of the Field

We represent the static field $B_z$ in an MRI magnet by a sum of spherical harmonics $$B_z = \sum_{n=0}^{\infty} \sum_{m=-n}^{m=n} A_{nm} r^n Y_{nm}(\theta, \phi) \qquad 1$$

where the $Y_{nm}$ are spherical harmonics according to the Bethe definition in which $x = \cos\theta$ $$Y_{nm} = (\tfrac{1}{2}\pi)^{1/2} p_{nm}(x) \exp(im\phi) \qquad 2$$

and where $$p_{nm} = \left\{ \frac{(2n+1)(n-m)!}{2(n+m)!} \right\} (1-x^2)^{m/2} \frac{d^{m+n}}{dx^{m+n}} (x^2-1)^n \qquad 3$$

Relationship Between Field and Current

Consider currents on planes above and below the imaging volume. The current density $J(\phi,\rho)$ must satisfy the two-dimensional continuity equation, $$\partial J_\phi / \partial \phi = \partial \rho \cdot J_\rho / \partial \rho = 0 \qquad 4$$

where $\rho$ and $\phi$ are the radial and angular coordinates as shown in FIG. 1. Current lies on a first plane at z=a and a second plane at z=−a.

We employ a current density described by a summation of sine and cosine functions and which is non-zero over a finite region only. A current density that satisfies the continuity equation (4) can be written as $$J_\rho = \sum_{q=0}^{Q} U_{qk} \sin(qc(\rho - \rho_o)) \sin k\phi \quad \text{and} \qquad 5$$

$$J_\phi = \sum_{q=0}^{Q} U_{qk} (qc/k) \cos(qc(\rho - \rho_o)) \cos k\phi \qquad 6$$

where $$c = \pi/(\rho_m - \rho_o)$$

where q and k are integers and $\rho_m$ and $\rho_o$ are the maximum and minimum radii.

One needs only consider one k value at a time to design gradient coils and most shim coils. When k=1, the solution for the current density yields the x-gradient coil. When k=0, one obtains a z-gradient coil or a constant. By rotating 90 degrees, an x-gradient coil becomes a y-gradient coil.

Shim coils are obtained the same way for k>2. Rotation by 45 degrees transforms an $x^2-y^2$ shim coil into a 2xy shim coil. Third order shim current densities can be rotated 30 degrees to produce other useful shims. It is convenient to use the above current density for all terms and rotate it to get shim terms not covered by the formula.

Given the current density, we calculate the magnetic gradient or shimming field from $$B = (\mu_o/4\pi) \nabla \times \int dV' J(r')/|r-r'| \qquad 7$$

where J(r') is the current density (in vector form) obtained from the solution of the continuity equation provided by Equations 5 and 6, r' is the distance from the origin 0 to a point on the coil in the plane S in FIG. 1, and r is the distance from the origin to a point in space between the origin 0 and the plane S. By expanding $1/|r-r'|$ in Equation 7 in spherical harmonics, it can be shown that the z component of the magnetic gradient or shimming field is $$B_z = -\mu_o Re \sum_{n=1}^{\infty} r^{n-1} Y\{n-1, k(\theta, \phi)\} K_{nk} \qquad 8$$

where $$K_{nk} = \sum_{q=0}^{Q} \left[ \frac{\pi(n-k+1)(n-k)(n-k+1)!}{(2n-1)(n+k-1)!} \right]^{1/2} U_{qk} \cdot$$

$$\int d\rho\, r^{-n-1} [(qc\rho/k)\cos[qc(\rho-\rho_o)] + \sin[qc(\rho-\rho_o)]P_{n,k-1}\cos\theta)$$

where $P_{n,k-1}$ is an associated Legendre polynomial.

Values of the coefficients of the mathematical expansion representative of the current distribution (Equations 5 and 6) which null out predetermined terms in the mathematical expansion of the magnetic field (Equation 8) are calculated to determine the current distribution which will generate the desired non-uniform magnetic field.

The coefficients in the mathematical expansion representative of the current distribution to be approximated by the set of windings can be determined by solving a matrix equation. The matrix equation comprises a rectangular matrix having rows equal to the amplitudes of the expansion coefficients of the magnetic field produced by current distributions corresponding to single terms in the expansion for current distribution, having one row for each component in the expansion for the magnetic field component along the static field direction. The rectangular matrix is multiplied by a first column matrix whose elements are the amplitudes of the terms in the expansion of the current distribution. The rectangular and column matrices are set equal to a second column matrix whose elements are the amplitudes corresponding to the terms in the expansion of the magnetic field which produce a desired linear magnetic field variation of the component along the static field.

EXAMPLES

The equations for the current density, and hence the current, can be solved by well known numerical methods on a digital computer. Alternatively, convenient commercially available equation solver programs which will run on a personal computer can be used. These equation solver programs accept as input the equations to be solved in symbolic form and do not require the user to program the computer in order to obtain a solution. Two such programs of sufficient power are Mathematica (TM) and Maple V (TM).

Figure 2:
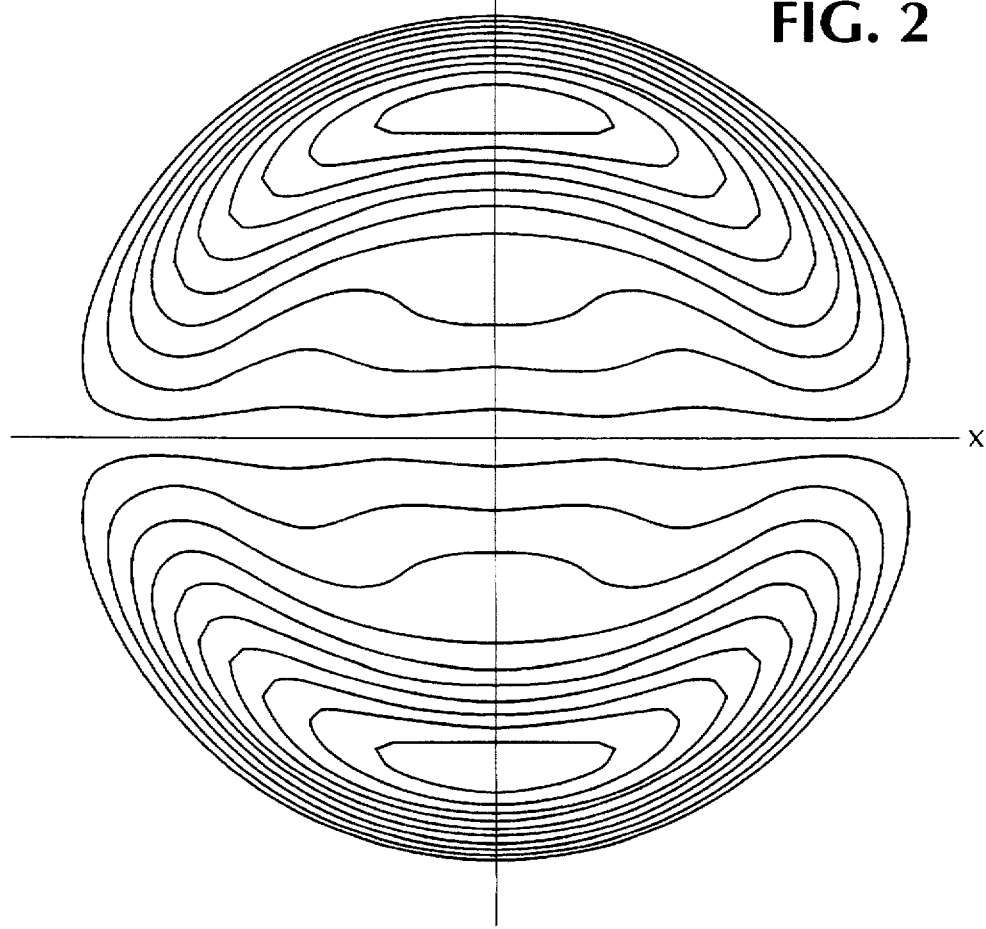
FIG. 2 is a plan view of the current contours and conductor paths of a gradient coil according to the invention.

FIG. 2 shows the current contours for an x-gradient (or y-gradient) coil for a vertical field MRI system having circular poles. The physical gradient coil would comprise conductors, such as wires, disposed along the contours shown and electrically connected in series. The current contours are drawn to scale.

Figure 7:
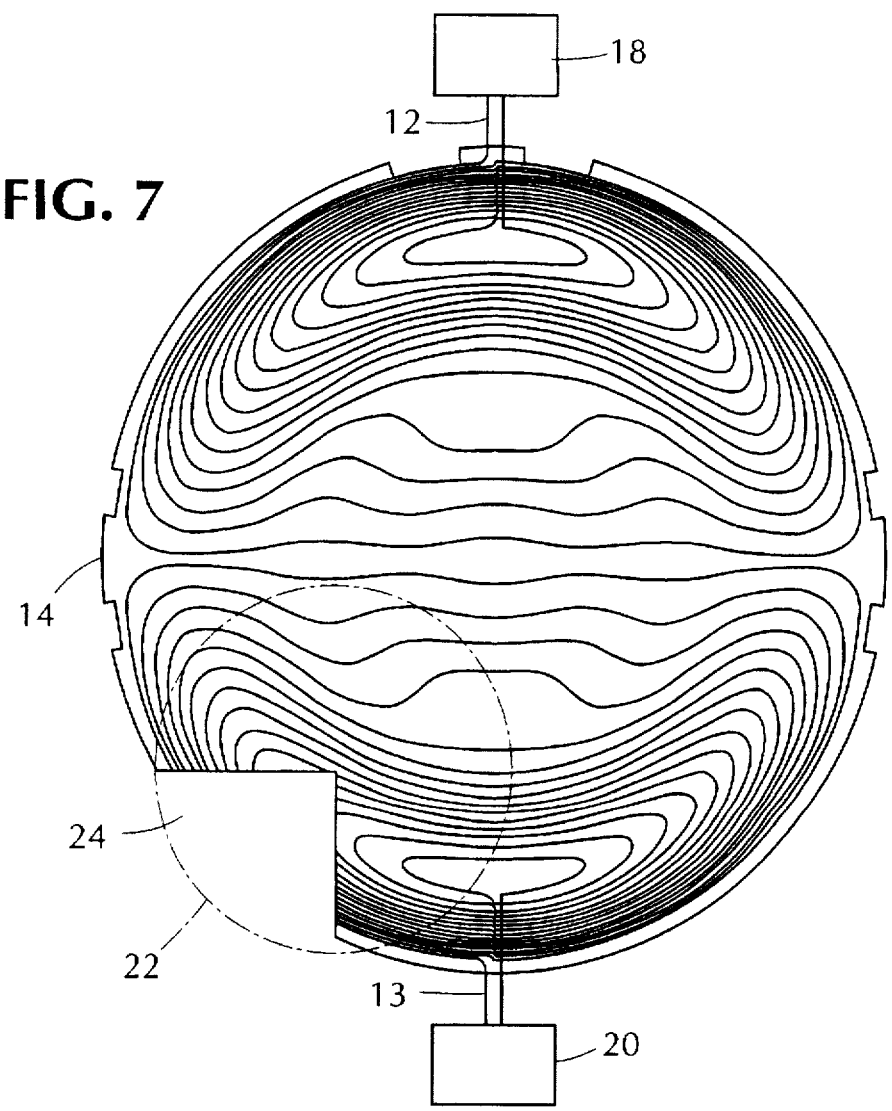
FIG. 7 is a top view of a gradient coil assembly according to the invention approximating the current contours of FIG. 2, including a portion 22 with a cut-out section 24.
Figure 8:
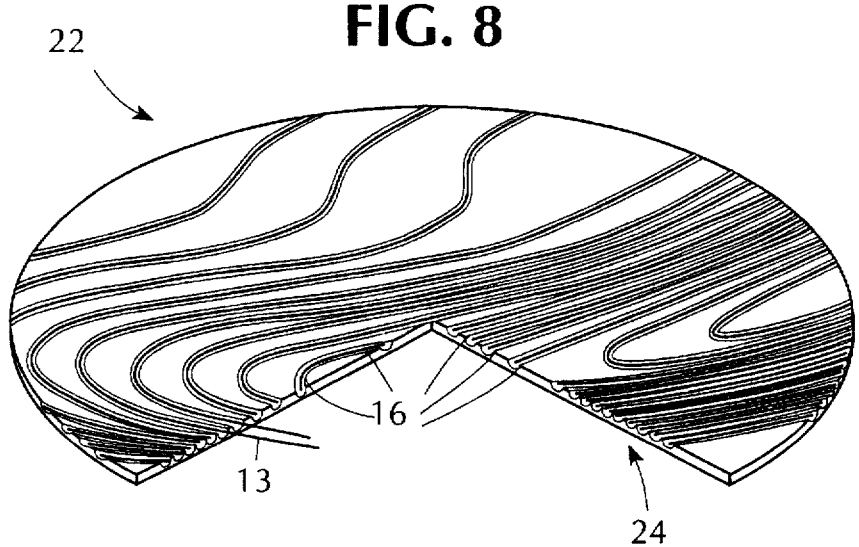
FIG. 8 is a perspective view of portion 22 of FIG. 7.

FIG. 7 is a top view of a gradient coil assembly 10 according to the present invention, wherein wire 12 approximates the current contour above the x-axis of FIG. 2 and wire 13 approximates the current contour below the x-axis. The wires 12, 13 are supported by an insulative support 14, which is planar in this embodiment. The wires 12, 13 may be disposed on the surface of the support 14, or embedded in grooves 16 in the surface of the support 14. A current source 18, 20 is connected to the ends of each wire 12, 13, respectively. The wires 12, 13 could be connected in series with a single current source, as mentioned above and known in the art. FIG. 7 includes a portion 22 having a cut-out section 24. FIG. 8 is a perspective view of the portion 22 and cut-out section 24, showing the grooves 16 and wire 13. A gradient coil system would typically comprise a plurality of coils supported by a plurality of insulative supports.

Figure 3:
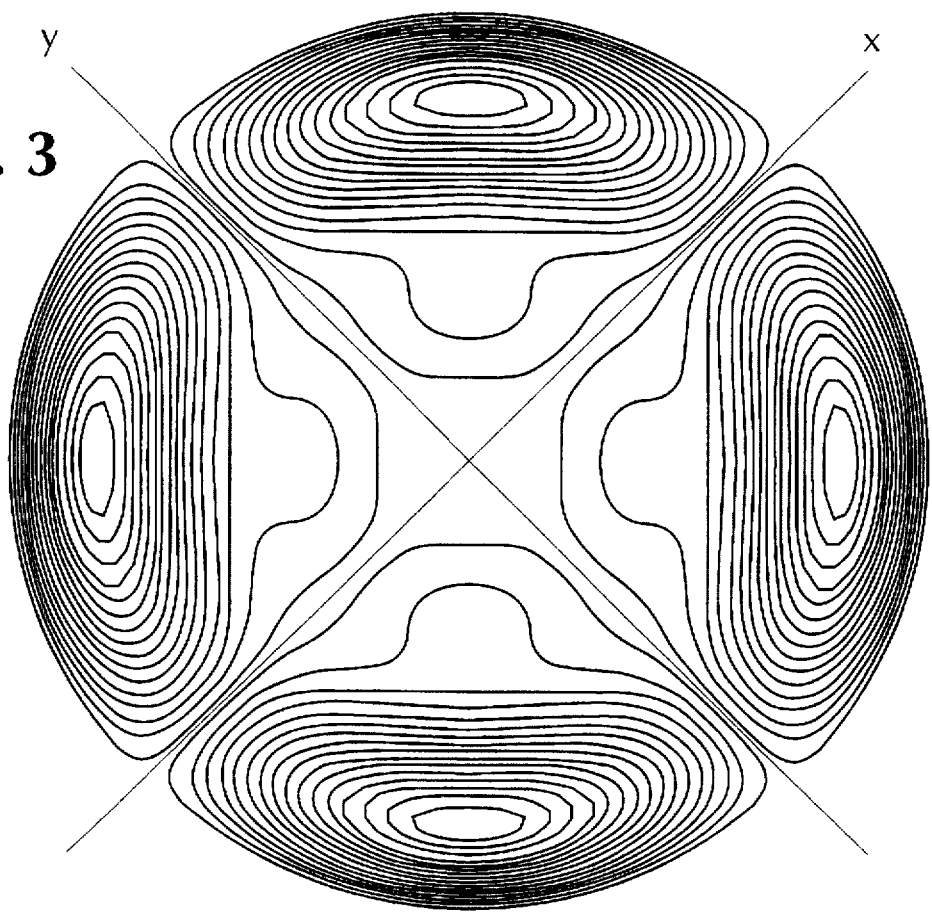
FIG. 3 is a plan view of the current contours and conductor paths of a shim coil according to the invention.

FIG. 3 shows the current contours for a shim field for $x^2-y^2$ field terms, corresponding to k=2. The physical shim coil would likewise comprise conductors disposed along the contour lines and electrically connected in series. The current contours are drawn to scale.

Figure 4:
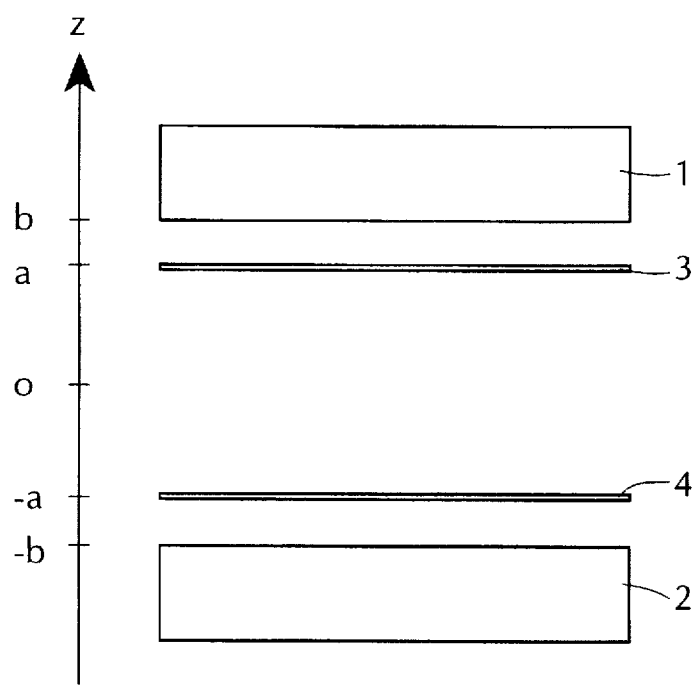
FIG. 4 is a vertical elevation of a pair of magnet poles in an MRI system showing gradient coil and image current positions.

FIG. 4 illustrates a pair of ferromagnetic poles 1,2 of a vertical field MRI system. A pair of gradient coils 3,4 are positioned at distances ±a, respectively, from the center of the gap between the magnet poles 1,2. The poles have respective pole faces positioned at distances ±b from the gap center where b>a. In this preferred embodiment the pole faces are circular.

An electrical current between two perfectly conducting planes produces an infinite number of image currents. In the following discussion the ferromagnetic poles 1,2 will be treated as conducting planes at their pole faces, i.e. at distance b from the gap center. It is desired to add a companion set of coils at ±b so that the magnetic field outside the gap, z>b, will be as low as possible. Thus, self shielded gradients would be realized.

The tangential component $H_t$ of the magnetic intensity at z=±b resulting from the gradient coil current is computed. Image currents in planes on opposite sides of the gap must be taken into account when computing $H_t$. Because images further from the center contribute less to the field, only a finite number need be considered.

For transverse gradient coils and poles separated by a distance 2b, positive images are located at $$z=(2j-1)b+(-1)^j(b-a)$$

where j=1,2,3 . . . , and negative images are located at $$z=(2j-1)b-(b-a).$$

For a longitudinal or z-gradient coil positive images are located at $$z=(2j-1)b-(-1)^j(b-a),$$

and negative images occur at $$z=(2j-1)b+(b-a).$$

Once $H_t$ is determined the current density needed at z=±b to shield the magnetic field, e.g. the shield coils, is solved simply from $$J_t=H_t \times n.$$

Figure 5:
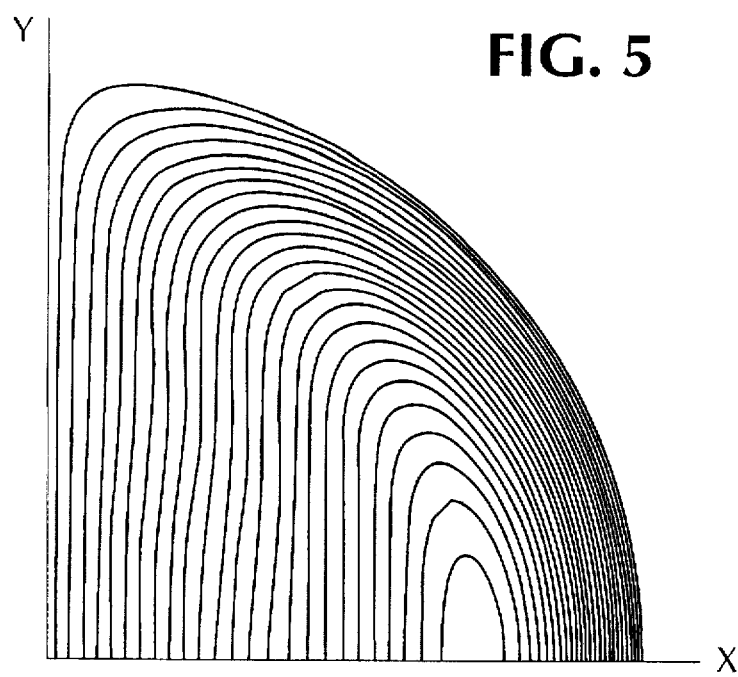
FIGS. 5 and 6 are plan views respectively showing one quadrant of the current contours and conductor paths of a gradient and shield coil for a self-shielded gradient coil according to the invention.
Figure 6:
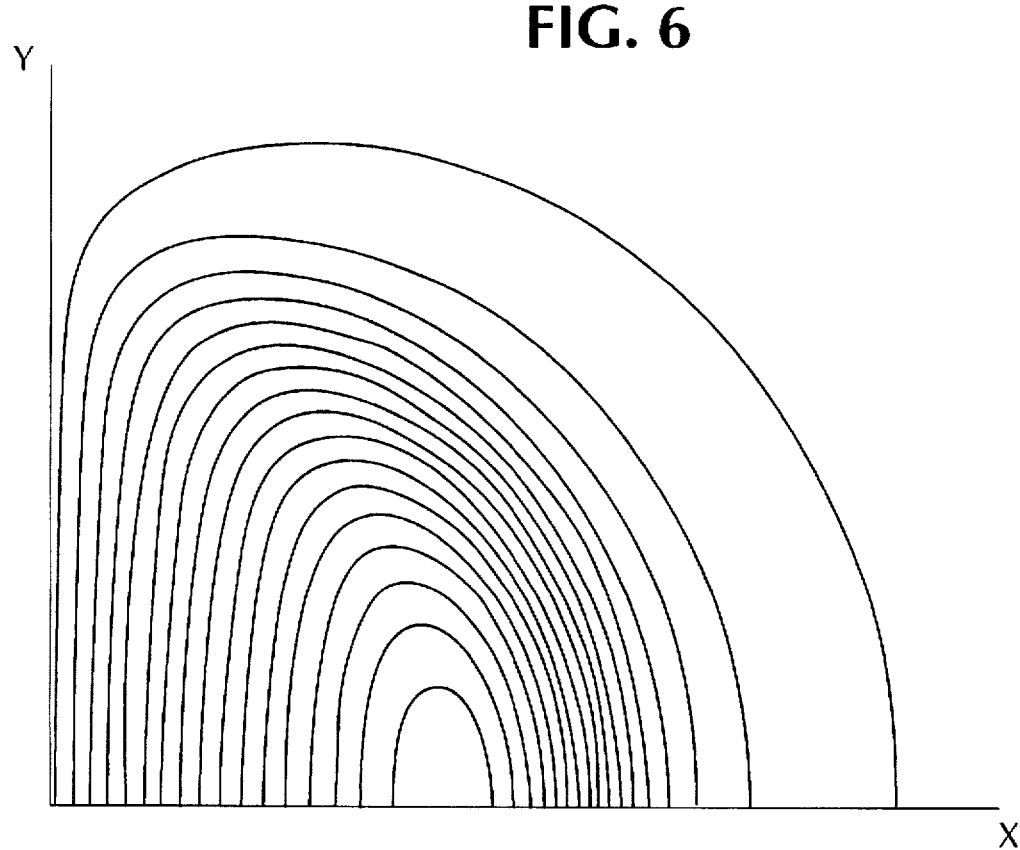

FIGS. 5 and 6 respectively show one quadrant of the current contours for an x-gradient coil and the x-gradient shield coil. The current contours in both FIGS. 5A and 5B are drawn to scale both within each Fig. and relative to each other. The physical gradient and shield coils are realized by connecting the contours of each coil electrically in series and by connecting the two coils electrically in series. A pair of such gradient coil-shield coil sets, when a current flows through them, will result in a gradient magnetic field within the magnet gap with at most a substantially attenuated field at the pole faces. Consequently, the pair of gradient coil-shielded coil sets constitutes a pair of self-shielded gradient coils.

A quiet gradient coil system for magnetic resonance imaging scanners can be provided by securing a conductive wire within a surface groove of an insulative support with a securing means which reduces gradient coil flexure and resultant audible noise caused by current pulses flowing through the gradient coil. The means for securing may comprise an adhesive material disposed within the groove, such as the grooves 16 of the support 14 of FIGS. 7 and 8. As in FIGS. 7 and 8, the insulative support may be planar. The means for securing may also comprise a second planar insulative member disposed on the planar surface of the planar insulative support. The second planar insulative member is maintained against the planar surface of the insulative support to secure the wire 13 within the surface groove 16 of the support 14. The means for securing may also comprise the walls of the surface groove 14, wherein the surface groove 14 is dimensioned to provide a friction fit between the wire 13 and the walls of the groove 16.

I claim:

1. A gradient coil assembly for a magnetic resonance imaging device comprising:

an insulative coil support having a major surface;

a conductive wire for generating a non-uniform magnetic field when the wire is coupled to a current source, the wire being coupled to the coil support and having a path which approximates a calculated current distribution of finite extent, wherein the calculated current distribution satisfies a current continuity equation, and is determined by:

representing a current distribution by a first mathematical expansion in a set of base functions; and representing a non-uniform magnetic field by a second mathematical expansion in a complete set of functions, wherein the second mathematical expansion includes the first mathematical expansion; and calculating the current distribution which cancels terms of the second mathematical expansion of the magnetic field such that the calculated current distribution generates the non-uniform magnetic field.

2. A coil assembly according to claim 1, wherein:

said insulative coil support is planar and the major surface is planar; and said conductive wire defining a coil is disposed on said planar major surface.

3. A coil assembly according to claim 1, further comprising:

a second conductive wire defining a shield coil electrically connected in series with said gradient coil; and means for supporting said shield coil relative to said gradient coil such that said shield coil and said gradient coil develop a net magnetic field on the shield coil side of the gradient coil assembly substantially less than the net magnetic field on the side of the gradient coil opposite the shield.

4. The gradient coil assembly of claim 1, wherein the non-uniform magnetic field generated by the calculated current distribution cancels non-uniformities in the magnetic field of the magnetic resonance imaging device by cancelling terms of the second mathematical expansion representative of a non-uniformity in the magnetic field of the magnetic resonance imaging device.

5. The gradient coil assembly of claim 1, wherein the calculated current distribution generates the gradient field.

6. The gradient coil assembly of claim 1, wherein the non-uniformities in the magnetic field are linear.

7. The gradient coil assembly of claim 1, wherein the non-uniformities in the magnetic field are non-linear.

8. A system for magnetic resonance imaging comprising a magnet with an imaging volume, the magnet producing a static magnetic field, and a coil subsystem comprising a current source for producing a non-uniform magnetic field which contains a field component along the static field direction, in which said component is approximately constant in two coordinate directions, but which varies approximately linearly in the third coordinate direction, the coil subsystem further comprising a set of current carrying windings coupled to the current source, said windings partially surrounding the imaging volume and having a geometry approximating a continuous current distribution which is finite in extent and which is represented by an expansion in an orthogonal set of functions with a finite number of terms, and said current distribution having a locus to develop a field to null out certain terms in a mathematical expansion in a complete set of functions of the component of the magnetic field created by said current distribution along the static field direction, but which do not null out the terms for creating the non-uniform magnetic field.

9. The system according to claim 8, wherein the coefficients in the expansion representing the current distribution to be approximated by said set of windings are the solution of a matrix equation comprising a rectangular matrix multiplied by a first column matrix whose elements are the amplitudes of the terms in the expansion of the current distribution, set equal to a second column matrix whose elements are the amplitudes corresponding to the terms in the expansion of the magnetic field, which are set to values for producing the linear magnetic field variation of the component along the static field, the rectangular matrix having rows equal to the amplitudes of an expansion coefficient of the magnetic field produced by current distributions corresponding to single terms in the expansion for current density, having one row for each component in the expansion for the magnetic field component along the static field direction.

10. The system of claim 8, wherein the expansion of the component of the magnetic field is a spherical harmonic expansion.

11. A magnet assembly for a whole body magnetic resonance scanner, comprising:

a magnet comprising a ferromagnetic yoke having a pair of ferromagnetic poles spaced to define an air gap for receiving a patient and for developing a magnetic field in the gap to permit magnetic resonance scanning of the patient, and a magnetic return path from one side of the gap to the other;

a magnetic field source for generating a magnetic field within the ferromagnetic yoke and across the air gap; and a pair of gradient coil sets disposed for developing gradient magnetic fields within the gap, each gradient coil set comprising a gradient coil and a shielding coil for shielding time variations in the gradient magnetic field from eddy currents induced in a respective one of said ferromagnetic poles;

wherein said gradient coil sets each comprise a gradient coil having a locus defining a current path which approximates a first current distribution satisfying a current continuity equation which is non-zero over only a finite region of space and which is effective to develop a gradient magnetic field and a shield coil proximate said gradient coil and having a locus defining a current path which approximates a second current distribution satisfying the current continuity equation which is non-zero over only a finite region of space and which is effective to develop a magnetic field to at least partially cancel the gradient field and reduce the net magnetic field outside of the gap.

12. The magnet assembly of claim 11, wherein the gradient coil and shielding coil are planar.

13. In a magnetic resonance scanner of the type having a pair of ferromagnetic pole pieces disposed facing each other and spaced apart to define a patient-receiving space between them, and gradient coils for developing gradient magnetic fields within the patient-receiving space, the improvement comprising:

said gradient coils comprising self-shielded gradient coils disposed adjacent said pole pieces for developing gradient magnetic fields between said pole pieces within the patient receiving space such that said gradient coils develop substantially no magnetic field adjacent said pole pieces;

wherein said gradient coil sets each comprise a gradient coil having a locus defining a current path which approximates a first current distribution satisfying a current continuity equation which is non-zero over only a finite region of space and which is effective to develop a gradient magnetic field and a shield coil proximate said gradient coil and having a locus defining a current path which approximates a second current distribution satisfying the current continuity equation which is non-zero over only a finite region of space and which is effective to develop a magnetic field to at least partially cancel the gradient field and reduce the net magnetic field outside of the gap.

14. The magnetic resonance scanner of claim 13, wherein the gradient coils and shim coils are planar.

15. A quiet gradient coil system for magnetic resonance imaging scanners, comprising:

an insulative support for supporting a conductor having a locus which defines a current path effective to create a gradient magnetic field when a current flows through said conductor, said insulative support having a surface with a continuous surface groove formed therein having a locus identical to the current path to be established;

a current source;

a conductive wire disposed in the surface groove continuously along the length of the groove and coupled to the current source to define a gradient coil for creating a gradient magnetic field when a current having a predetermined value flows through said gradient coil, wherein said groove contains only a single length of the wire; and wherein said surface groove is dimensioned relative to said wire to provide a friction fit therebetween, such that the walls of said surface groove and a surface of said length of wire are in frictional contact therewith to reduce gradient coil flexure and resultant audible noise in response to current pulses flowing through said gradient coil for the purpose of creating pulsed gradient magnetic fields.

16. A quiet gradient coil system according to claim 15, further comprising:
a plurality of insulative supports each having a respective surface groove and wire disposed therein to define respective gradient coils.

17. A quiet gradient coil system according to claim 15, wherein said insulative support is planar and includes a principal planar surface having said surface groove found therein,
further comprising adhesive material disposed within said surface groove securing the entire length of the wire to said surface groove.

18. A quiet gradient coil system according to claim 15, wherein said insulative support is planar and includes a principal planar surface having said surface groove formed therein,
the system further comprising a second planar insulative member disposed on said principal planar surface, against said principal planar surface for securing said wire within said surface groove.

19. A quiet gradient coil system according to claim 17, wherein said insulative support is planar and includes a principal planar surface having said surface groove formed therein,
the system further comprising a second planar insulative member disposed on said principal planar surface, against said principal planar surface for securing said wire within said surface groove.

20. A method of manufacturing a coil for use in nuclear magnetic resonance experiments to generate a non-uniform magnetic field, comprising:
representing a current distribution by a first mathematical expansion in a set of base functions representing a point on the major surface of the coil support and satisfying a current continuity equation;
representing a non-uniform magnetic field by a second mathematical expansion in a complete set of functions of two parameters, wherein the second mathematical expansion includes the first mathematical expansion;
calculating the values of coefficients of the first mathematical expansion representative of the current density which null out terms in the second mathematical expansion representative of the magnetic field such that the resulting current density generates the non-uniform magnetic field;
providing an insulative support; and
disposing conductors on said insulative support in a locus defined by the resulting current density.

21. The method of claim 20, wherein the second mathematical expansion is a spherical harmonic expansion.

22. The method of claim 20, wherein the calculating step comprises calculating the values of the coefficients such that the current density generates a non-uniform magnetic field which cancels non-uniformities in the magnetic field of a magnet.

23. The method of claim 20, wherein the calculating step comprises calculating the values of the coefficients such that the current density generates a gradient field.

24. The method of claim 20, wherein the first mathematical expansion is a Fourier series.

25. A system for magnetic resonance imaging comprising:
a magnet with an imaging volume, the magnet producing a static magnetic field;
a coil subsystem comprising a current source for producing a magnetic field, and
a set of current carrying windings coupled to the current source, said windings positioned with respect to the imaging volume to generate a magnetic field within the imaging volume and having a geometry approximating a continuous current distribution which is finite in extent and which is represented by an expansion in an orthogonal set of functions with a finite number of terms, said current distribution having a locus to develop a field to null out certain terms in a mathematical expansion in a complete set of functions of a component of the magnetic field created by said current distribution but which do not null out the terms for creating the magnetic field.

* * * * *

UNITED STATES PATENT AND TRADEMARK OFFICE
CERTIFICATE OF CORRECTION

PATENT NO. : 5,760,582
DATED : June 2, 1998
INVENTOR(S) : Terry Morrone

It is certified that error appears in the above-identified patent and that said Letters Patent is hereby corrected as shown below:

Col. 3, line 36, "$\partial J\phi/\partial\phi = \partial\rho \cdot J\rho/\partial\rho = 0$" should read --$\partial J\phi/\partial\phi + \partial\rho \cdot J\rho/\partial\rho = 0$--.

Signed and Sealed this

Fifteenth Day of December, 1998

Attest:

BRUCE LEHMAN

*Attesting Officer*  *Commissioner of Patents and Trademarks*